(12) United States Patent  
Ramschak

(10) Patent No.: US 7,531,253 B2  
(45) Date of Patent: May 12, 2009

(54) METHOD FOR MONITORING THE OPERATIONAL STATE OF A FUEL CELL STACK

(75) Inventor: Erich Ramschak, Vasoldsberg (AT)

(73) Assignee: AVL List GmbH, Graz (AT)

( * ) Notice: Subject to any disclaimer, the term of this patent is extended or adjusted under 35 U.S.C. 154(b) by 819 days.

(21) Appl. No.: 11/242,121

(22) Filed: Oct. 4, 2005

(65) Prior Publication Data

US 2006/0078788 A1 Apr. 13, 2006

(30) Foreign Application Priority Data

Oct. 7, 2004 (AT) ................ 1678/2004

(51) Int. Cl.  
*H01M 8/04* (2006.01)

(52) U.S. Cl. .......................... 429/13; 429/23

(58) Field of Classification Search ........... 429/13, 429/22, 23, 90, 537  
See application file for complete search history.

(56) References Cited

U.S. PATENT DOCUMENTS

| | | | | |
|---|---|---|---|---|
| 6,762,587 | B1* | 7/2004 | Barbetta | 320/116 |
| 6,816,797 | B2* | 11/2004 | Freeman et al. | 702/65 |
| 7,179,553 | B2* | 2/2007 | Murphy et al. | 429/12 |
| 2002/0025464 | A1* | 2/2002 | Breuer | 429/22 |
| 2004/0091759 | A1* | 5/2004 | Harrington et al. | 429/22 |

* cited by examiner

*Primary Examiner*—Jonathan Crepeau  
*Assistant Examiner*—Patricia Davis  
(74) *Attorney, Agent, or Firm*—Dykema Gossett PLLC

(57) ABSTRACT

The invention relates to a method for monitoring the operational state of a fuel cell stack comprising a plurality of series-connected single cells. In order to significantly reduce measuring costs and apparatus a low-frequency current or voltage signal is impressed on the fuel cell stack and the resulting current or voltage signal is measured. From at least one change of the harmonic content of the signal the operational state of individual cells of the fuel cell stack is inferred.

20 Claims, 4 Drawing Sheets

METHOD FOR MONITORING THE OPERATIONAL STATE OF A FUEL CELL STACK

BACKGROUND OF THE INVENTION

The invention relates to a method for monitoring the operational state of a fuel cell stack comprising a plurality of individual cells connected in series.

DESCRIPTION OF PRIOR ART

A single cell of a fuel cell stack can deliver an output voltage in the range of approximately 0.7 to 1.0 volts. In order to obtain the desired performance with a given cell area the single cells are electrically connected in series, thus making up a so-called stack. Serial connection is applied to all types of fuel cells and electrical storage elements such as batteries.

Inherent in the series connection principle is the potential danger that failure of any one cell will cause the failure of the whole stack. The possible failure of a cell is monitored by measuring all the voltages of the single cells. Large fuel cell stacks will thus require costly and complicated measurement arrangements.

Quality control during the manufacture of fuel cells requires all cells to be checked for function and performance. This can be accomplished—provided that the contacts are accessible—by measuring individual cell voltages. Due to the costs involved in this procedure, however, measuring individual cell voltages is undesirable during manufacture as well as during operation of fuel cells.

As an alternative the method of electrical impedance spectroscopy (EIS) is used in the laboratory to monitor the operational state or the "health" of a fuel cell stack. In this method the complex impedance (i.e. the Nyquist curve) of the fuel cell stack is measured over a certain frequency range and compared with reference curves.

From the frequency at which typical changes in the impedance curve occur it can be inferred whether these changes are related to the anode, cathode or membrane of the cell. The method is based on the fact that the equivalent electrical circuit of the fuel cell stack is a series-parallel circuit of first order low-pass filters with widely differing cut-off frequencies, thus providing the desired selectivity.

The following effects in a fuel cell stack (e.g. a PEM-fuel cell operated with air and $H_2$) necessitate monitoring the voltage of individual cells.
- Air or hydrogen deficiency at cathode or anode (stoichiometric deficiency). Effect: the U/I (voltage/current) characteristic will already drop at small currents.
- Membrane: occurrence of electrical short circuits or gas short circuits. Effect: $U_0$ (voltage at zero current) will change.
- Electrode aging. Effect: U/I characteristic drops more sharply, ohmic resistance increases due to corrosion effects.

When single cell voltage measurement is used for monitoring a fuel cell stack it is usual, with a stack of e.g. 500 single cells, to measure and evaluate either all 500 voltages or at least the voltage of every second cell, i.e. 250 voltages. Such multi-channel voltage measurements are extremely costly, and the apparatus consumes space and weight (circuitry, connectors, A/D converters, high voltages in restricted spaces, acquisition electronics with a high common mode range).

These high costs are prohibitive for large production volumes and can only be accepted in niche applications.

A case in point is the cost of the CUTE project (CUTE=Clean Urban Transport for Europe) which operates 30 Citaro-Busses powered by fuel cells in 9 European cities. Each bus is furnished with two PEM fuel cells. The electric motor is designed for a power output of 200 kW at a voltage of 600V. From this it may be inferred that approximately 1000 single cells are connected to form one fuel cell stack. The individual cells, or at least every second cell, are contacted by gold wire and are permanently measured and evaluated daily (entailing high costs for measurement, data-storage and data-analysis).

Monitoring methods which are based on impedance spectroscopy refer to stored or learned reference values or reference curves. These references represent target values for a "healthy" i.e. non-critical operational state. This entails that all operational states under given conditions (pressure, temperature, humidity etc.) must be known in advance and stored for each single fuel cell manufactured. If a large number of cells has to be calibrated the time and cost expended will soon become relevant.

In the case of stacks with a large number of cells the individual cell impedances are supposed to obey the normal distribution. "Outliers" are practically not detectable or can only be recognized by again reverting to the measurement of individual voltages. Besides, the method is optimally suited only for stationary load states.

Furthermore, electrical impedance spectroscopy is time-consuming since the impedance can be measured at each stepwise ascending frequency value only after transients have decayed.

In practical applications of a fuel cell stack consisting of a plurality of single cells it is required not only to recognize the defect of a single cell but also the situation leading up to the defect, in order to be able to initiate proper counter-measures. In the extreme case the whole stack may have to be taken off-line. Methods which are based on reference curves or on the assumption of certain statistical distributions cannot guarantee the reliable recognition of such situations.

SUMMARY OF THE INVENTION

It is the object of the present invention to propose a method for monitoring the operational state of a fuel cell stack comprising a plurality of series-connected single cells, which incurs significantly lower measurement costs while permitting detection of defects and critical operational states of one or more cells, thus enabling the timely taking of counter-measures for the protection of the fuel cell.

It is a further object of the invention to permit quality control checking of the functionality and performance of every individual cell during fuel cell manufacture, keeping the costs of contacting as low as possible (i.e. measuring only one voltage and one current in the ideal case).

The invention achieves its objective by proposing that a low-frequency current or voltage signal is impressed on the fuel cell stack, and that the resulting current or voltage signal is measured, and that the operational state of individual cells of the fuel cell stack is inferred from at least one change in the harmonic content of the signal. The operational state of individual cells of the fuel cell stack may for instance be inferred from a change in the total harmonic distortion (THD, defined as the ratio of the fundamental mode to the total harmonic content) of the signal.

If defects or critical situations occur in the fuel cell, non-linearities in the system response will result. These non-linearities distort the originally impressed signal and generate harmonics, i.e., the total harmonic distortion will increase significantly. The amount of THD, respectively the presence of harmonics, correlates with the stack variables to be monitored.

It is for instance possible to replace costly single cell voltage monitoring by one single voltage measurement, or very few measurements, e.g. eight measuring channels per 1000 cells, and by measuring the impressed load current. If the THD changes significantly it can be decided if and which measures are to be taken to protect or regenerate the fuel cell. None of the known methods permits during operation inferences regarding the state of the current/voltage characteristic of single cells on the basis of measuring only one voltage or very few voltages.

According to the invention increasing harmonic content of the signal permits to infer a non-linear operational state of at least one single cell of the fuel cell stack.

The measuring method according to the invention takes the following approach.

The U/I curves are linear in certain regions and non-linear in others. If a small sinusoidal current change, with very low THD, is impressed in a linear region—e.g. in the region of rated power—a sum voltage with low harmonic content will result, i.e. the THD is correspondingly small. If the THD increases this will signify that one or more cell voltage curves are now in the non-linear region, caused for instance by stoichiometric deficiency (see the early drop of the U/I characteristic in FIG. 1).

From the voltage amplitudes of fundamental mode and harmonics the gradient of the U/I curve in the linear as well as non-linear region may be inferred and the precision of the result may be improved.

The invention provides further that by analysis of harmonics, using an impressed low-THD load signal spread over the whole load range, a field of U/I curves with corresponding dispersion band may be obtained. This may be used for single cell monitoring or for quality control.

To improve the selectivity of the method the impressed signal may be made up by superposing a number of predetermined frequencies. The frequencies chosen are assigned to certain effects at the anode, cathode or membrane. In accordance with the location of the defect, i.e. at the anode, the distortion of the impressed signal is present only at the frequency assigned to the anode. If the impressed signal is for instance sinusoidal the distortion will generate only odd-numbered harmonics (Fourier analysis). To preserve the selectivity of superposed signals the individual frequencies must be chosen such that possibly generated harmonics do not overlap. The pattern which arises when the measured system response is transformed into the time-frequency domain, will contain additional usable information.

Frequency spectra generated by changes of the load during operation of the fuel cell will also cause a change of THD Comparison of the time-frequency transformed current and voltage signal will permit computation and elimination of the influence of a load change.

Analysis of the THD (THDA) may be carried out either in the time domain with the use of (digital or analogue) filters or by means of transformation into the frequency domain (using any kind of wavelet transformation, short-time Fourier transformation or Fast-Fourier-transform). Frequency transformation has the advantage of significantly improving the signal to noise ratio, thus in turn improving the sensitivity of the measuring method.

In the evaluation of signals which have been transformed into the time-frequency domain by means of short-time Fourier transformation, precision can be improved if the THD-analysis is based on the power spectrum and the spectral energy components of the generated harmonics are evaluated.

If internal electric short-circuits, fissures or interruptions have occurred, these can be detected by high frequency wave analysis of the waves reflected at the location of the defect. By considering propagation time and/or phase relations of the reflected wave the geometric location of the phenomenon and the kind of defect may be determined. Reflected waves either show a phase jump or are reflected with continuous phase depending on whether an electric short-circuit or an interruption occurred at the point of reflection.

The invention provides that the preferably sinusoidal impressed current or voltage signal have a frequency of at least 0.1 to 1,000 Hz, preferably around 10 Hz, or be composed of a plurality of predetermined frequencies. The impressed current or voltage signal may be superimposed on the proper load of the fuel cell either as an active or as a reactive power component and either as a short burst (whose length is coordinated with the frequency or the frequency pattern used) or as a continuous signal. Both methods may be applied either during operation or at a test site, for instance for quality control purposes.

In an advantageous variant of the invention only the AC-component of the measured current or voltage signal may be evaluated. But it is also possible to additionally use the DC-component for the evaluation.

The influence of load variations on the THD may be computed by the method of the invention and the result may be used in the harmonic analysis of the current or voltage signal.

It is furthermore possible to use a mathematical derivation of the DC-component of the current or voltage signal together with the actually measured signal for the evaluation.

Finally, the invention permits the additional use of the amplitude curve of the fundamental mode of the current or voltage signal for the evaluation.

DESCRIPTION OF THE DRAWINGS

The invention will be further described below, with reference to the enclosed drawings and diagrams.

FIG. 1 shows the U/I-diagram of a single cell N in normal operation and of a defective or failing single cell S. The rapid voltage drop at small load of the single cell S is for instance due to stoichiometrically deficient operation of the cell. Whilst in this case the impressed sinusoidal current signal i(t) results in a distorted response signal (voltage signal S) in which harmonics can be detected (increased THD), in case N the current signal i(t) would lead to an undistorted sine signal, from which undisturbed normal functioning of the single cell N could be inferred.

FIG. 2 shows the logarithmic amplitude diagram of an actually measured stack voltage of a cell in stoichiometrically deficient operation, i.e. under air deficiency. A sine signal with frequency fo was superimposed on the load current of the fuel cell and the stack voltage was measured. The occurrence of only odd-numbered harmonics of the fundamental frequency (f3, f5, f7, f9, f11) confirms that the harmonics are caused by the impressed sine signal (as shown by the theory of Fourier analysis) and that the impressed sine signal has been distorted. The ratio of the sum of harmonics to the fundamental frequency is called total harmonic distortion THD, and is a measure of the degree of distortion of the signal and may be used to indicate critical (stoichiometrically deficient) operation of the fuel cell. From the magnitude of the amplitudes (fundamental frequency plus harmonics) the impedance of the fuel cell stack can be inferred.

Figure 1:
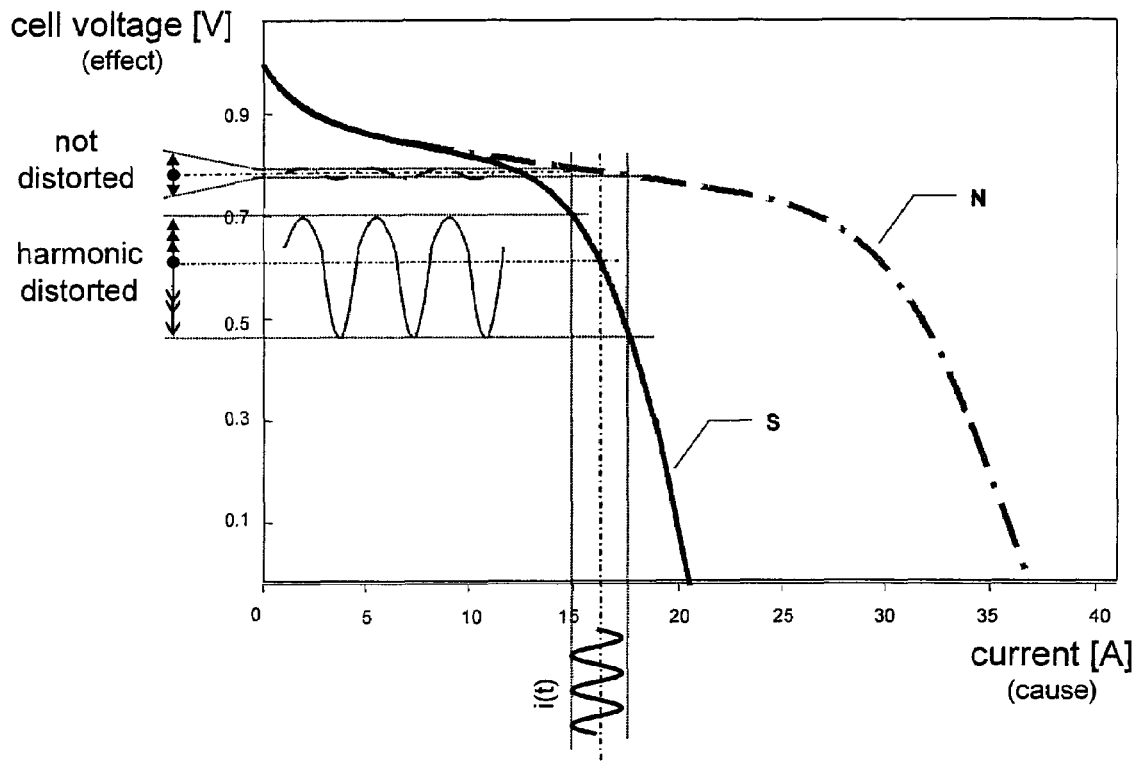
FIG. 1 shows U/I diagrams of a single cell in a correct operational state (N) and of a single cell under stoichiometrically deficient operation (S)
Figure 2:
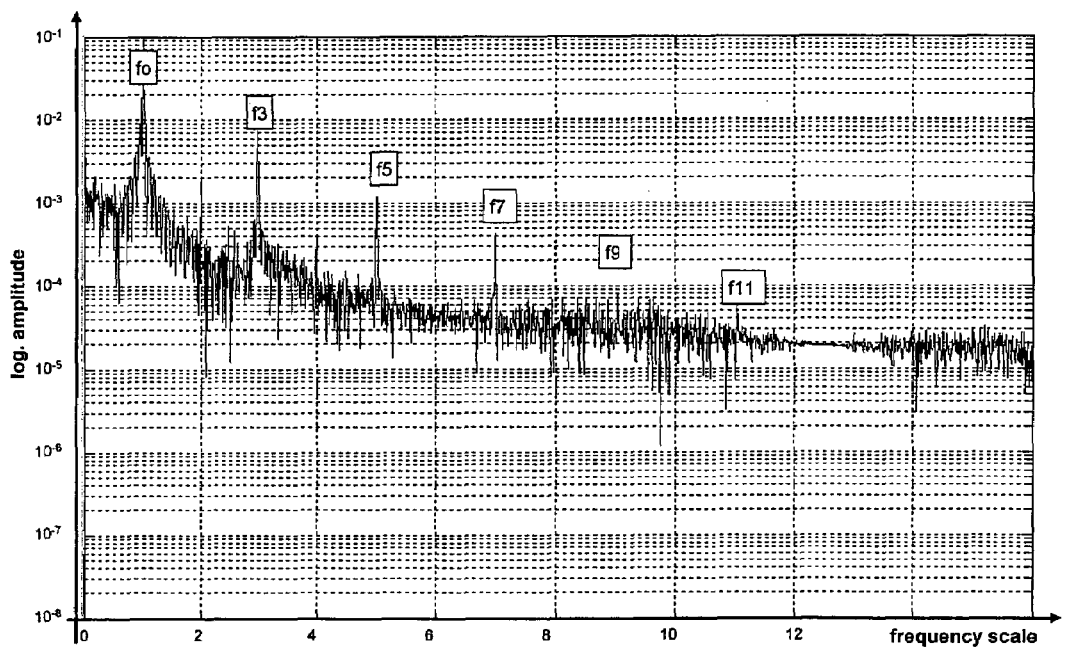
FIG. 2 shows the Fast-Fourier transformation (FFT) of the measured stack voltage of a fuel cell operated under stoichiometric deficiency with impressed sinusoidal current (fo) and with generated harmonics (f3, f5, f7, . . . f11)
Figure 3:
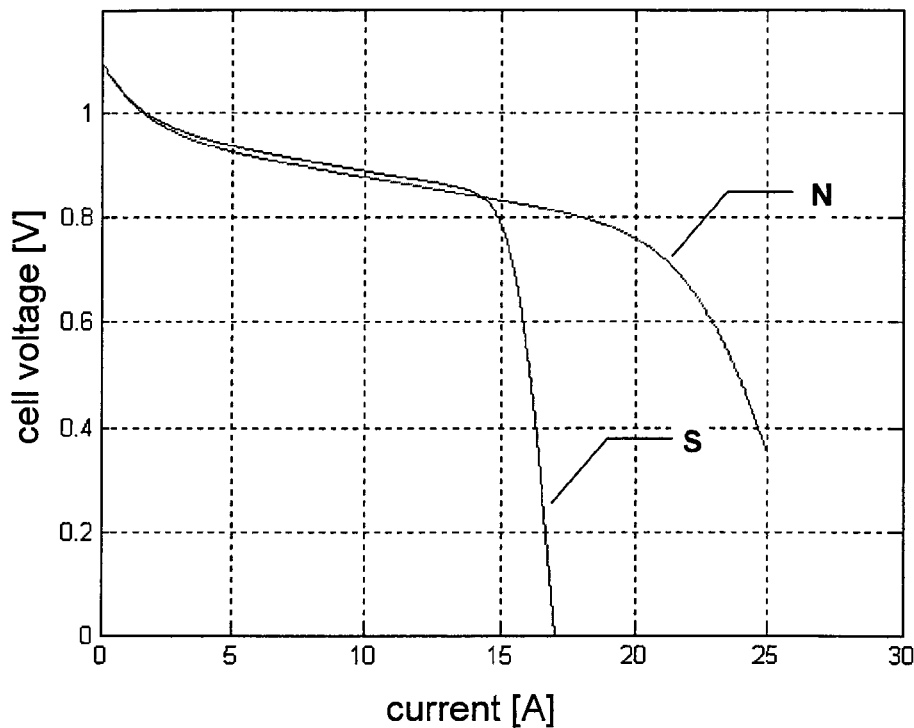
FIG. 3 shows an U/I diagram for two differing cells.
Figure 4:
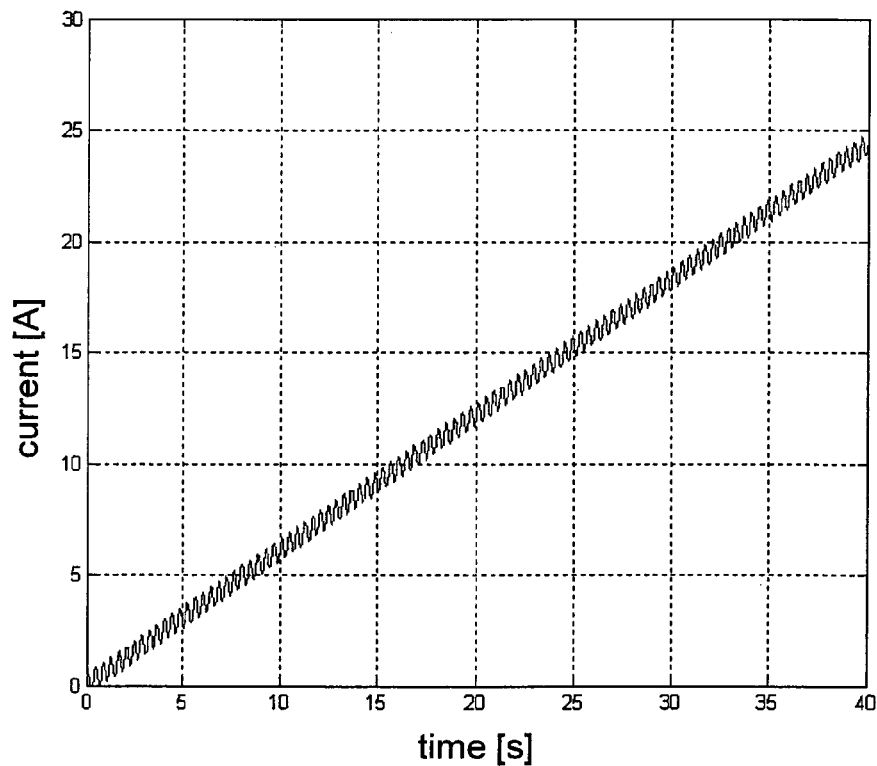
FIG. 4 shows a load current ramp with superimposed small sinusoidal current.
Figure 5:
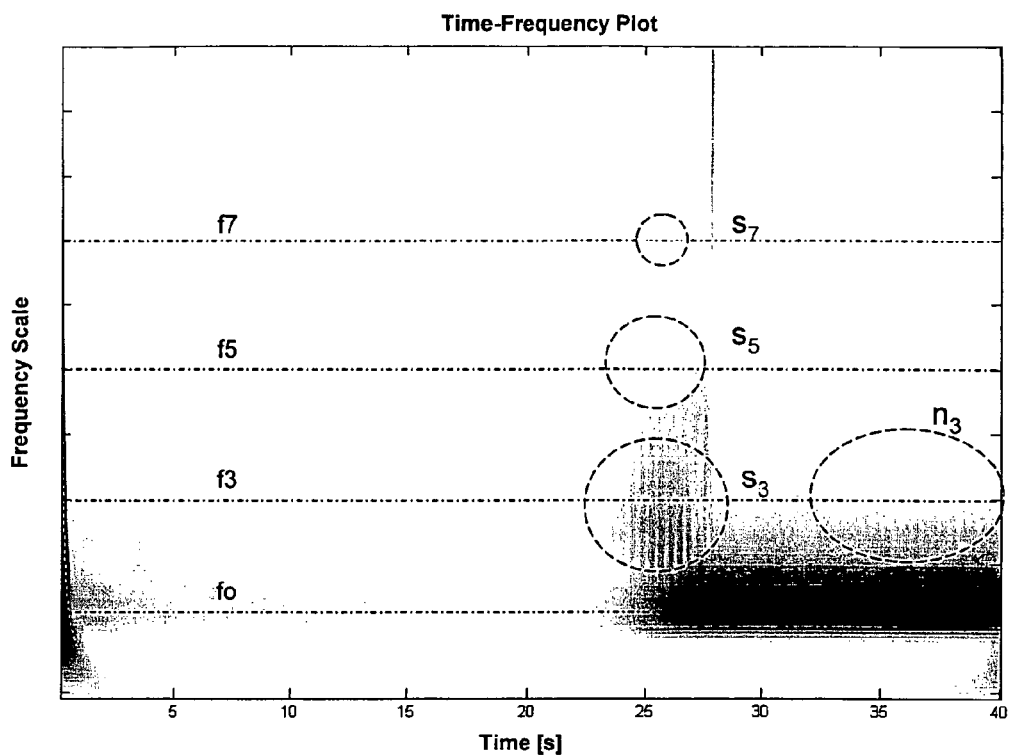
FIG. 5 shows a stack voltage signal transformed into the time-frequency domain (Morlet Wavelet Transformation)

Dynamic analysis is demonstrated in FIGS. 3 to 5. In the example the U/I characteristics of a two-cell set, similar to that of FIG. 1, are shown, with cell S operating in a critical state, while cell N is operating sufficiently supplied.

If this two-cell set is subjected to an ascending current ramp, with a small sine signal superimposed on the current, as shown in FIG. 4, time-frequency transformation of the sum voltage of the two-cell set, using wavelet or short-time Fourier transformation, may serve to visualize the generation of harmonics (FIG. 5). Due to the dynamic nature of the load signal Fast-Fourier transformation is here no longer applicable. The first occurrence of harmonics (see $s_3$, $s_5$, $s_7$ in FIG. 5) is detected at t=25 s, respectively at 15A load current, which is in close agreement with the time-point or the load current at the rapid current drop of cell S due to its stoichiometrically deficient air supply (see FIG. 3). In the region beyond 32 s, respectively at load currents above 20A, new occurrence of harmonics is observed (see $n_3$) indicating the current drop and thus the critical region of cell N. The selectivity between the individual harmonics depends on the sampling frequency chosen, on the window width (number of points measured) and on the fundamental frequency chosen. The influence of noise in the signal is significantly reduced if the evaluation is carried out in the frequency domain, since only the pertinent spectral noise component (i.e. noise amplitude per frequency unit) affects the harmonic components.

Figure 6:
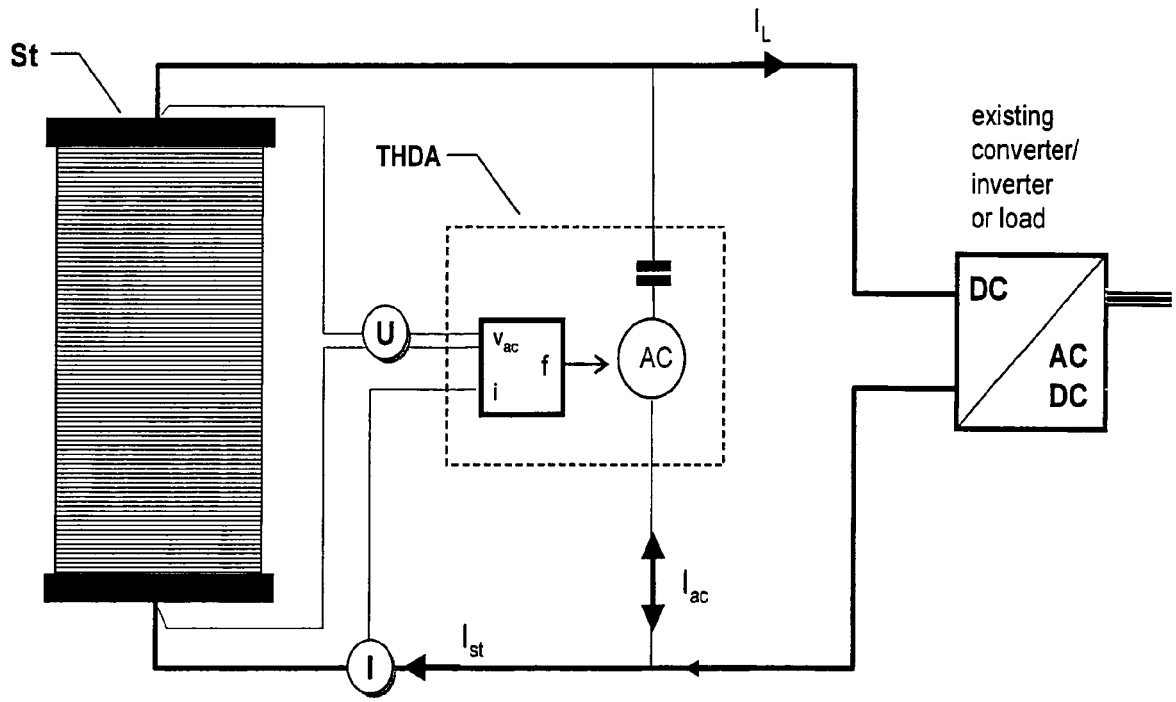
FIG. 6 shows the measurement principle of the invention in a schematic presentation.

The measurement set-up is schematically shown in FIG. 6. The stack current I and the stack voltage U of the stack or of substacks St are measured. Parallel to this a current or voltage signal with low THD is superimposed on the actual stack load by means of a controllable current/voltage sink THDA (total harmonic distortion analysis). In order to avoid consuming active power of the fuel cell, a capacitance or an inductance may be used, which will generate corresponding reactive power. Since many series-connected cells will produce a high DC-voltage, which is not relevant for the measurement method of the invention, only the AC-component of the stack voltage is digitized with high resolution.

Figure 7:
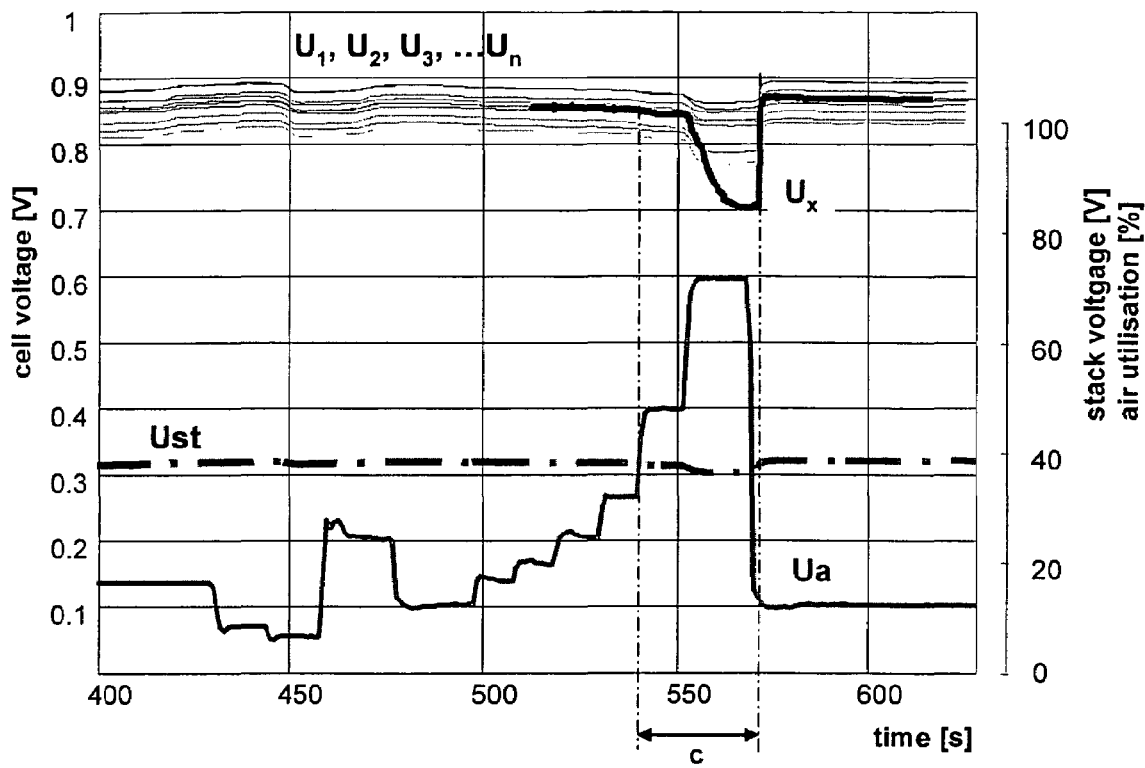
FIG. 7 shows a diagram of state-of-the-art measurement results of a solid oxide fuel cell (SOFC)

FIG. 7 shows the results of state-of-the-art measurements on a solid oxide fuel cell (SOFC) with 50 single cells, which is operated at constant load with decreasing air mass flow at the cathode (curve Ua)—i.e. with increasing air utilization—until a first cell voltage $U_x$ drops due to deficient supply for the first time (time=540 s) and then drops considerably (time=555 s, region c in FIG. 7). Evaluation of the total stack voltage $U_{st}$ of approximately 42 V would not indicate a critical operating situation, since the total voltage provides only a additive measure over the 50 single cell voltages. Only single cell measurement ($U_1$, $U_2$, $U_3$, ... $U_n$) indicates the drop in a single cell and thus a critical operating situation.

Figure 8:
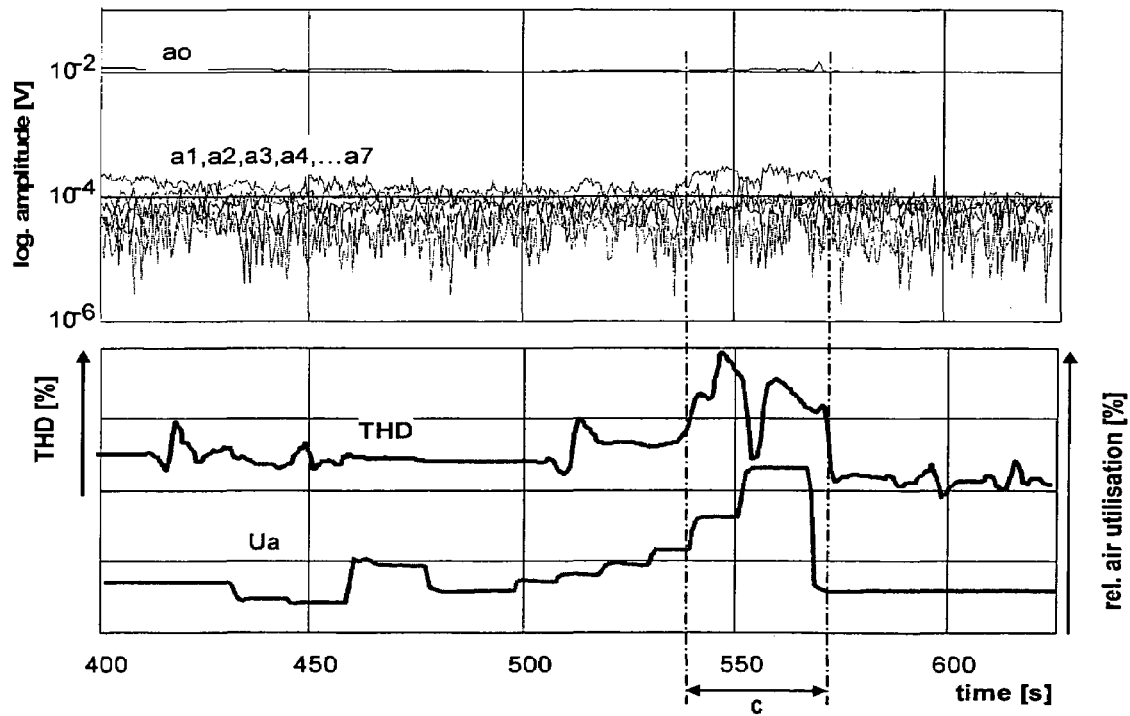
FIG. 8 shows a diagram of measurements according to the invention of the solid oxide fuel cell of FIG. 7.

Parallel to the above measurements a low-THD signal was superimposed on the load current and the total stack voltage $U_{st}$ was analyzed using the method of the invention (see FIG. 8). While the amplitude of the fundamental frequency ao remains essentially unchanged, it can be seen that the amplitudes of the harmonics a1, a2, a3, ... a7 show changes at the time when air supply deficiency occurs (upper part of FIG. 8, region c) and that the THD has significantly increased in this region (lower part of FIG. 8). Immediately after the critical situation has been relieved by an increase of the air supply (see curve Ua) the THD value drops to its initial value.

The invention claimed is:

1. A method for monitoring the operational state of a fuel cell stack comprising a plurality of individual cells connected in series, comprising the steps of:
impressing a low-frequency current or voltage signal on the fuel cell stack,
measuring the resulting current or voltage signal, and
inferring the operational state of individual cells of the fuel cell stack from at least one change in the harmonic content of said current or voltage signal.

2. A method according to claim 1, wherein increasing harmonic content of said signal permits to infer a non-linear operational state of at least one single cell of the fuel cell stack.

3. A method according to claim .1, wherein by analysis of harmonics, using an impressed low-THD load signal spread over the whole load range, a field of current/voltage curves with corresponding dispersion band is obtained.

4. A method according to claim 1, wherein the current and voltage signals during operation of the fuel cell stack are evaluated by a transformation of current and voltage into the time-frequency domain or by a Fourier transformation.

5. A method according to claim 1, wherein the current and voltage signals during operation of the fuel cell stack are evaluated with the use of analogue or digital filters.

6. A method according claim 1, wherein waves that are reflected at defective locations in the fuel cell stack are detected by high frequency wave analysis, and the geometric location of the phenomenon and the kind of defect are determined by considering propagation time and/or phase relations of the reflected wave.

7. A method according to claim 6, wherein an electric short-circuit in one of the individual cells is inferred from a phase jump of the reflected wave.

8. A method according to claim 6, wherein an electric interruption is inferred from a continuous-phase reflection.

9. A method according to claim 1, wherein a low-frequency sinusoidal current or voltage signal is impressed on the fuel cell stack.

10. A method according to claim 1, wherein the impressed current or voltage signal has a frequency of at least 0.1 to 1000 Hz.

11. A method according to claim 10, wherein the impressed current or voltage signal has frequency about 10 Hz.

12. A method according to claim 1, wherein the fuel cell stack is subject to a load current rising or falling linearly with time, on which is superimposed a current signal of small amplitude.

13. A method according to claim 12, wherein said superimposed current signal is sinusoidal.

14. A method according to claim 1, wherein the impressed current or voltage signal is a superposition of a plurality of predefined frequencies.

15. A method according to claim 1, wherein the impressed current or voltage signal is superimposed on the proper load of the fuel cell as an active or a reactive power component, either as a short burst or as a continuous signal.

16. A method according to claim 1, wherein only the AC-component of said measured current or voltage signal is evaluated.

17. A method according to claim 1, wherein the DC-component is evaluated in addition to the AC-component of said measured current or voltage signal.

18. A method according to claim 1, wherein the influence of load changes on the THD is computed and wherein the resulting measurement value is used for the harmonic analysis of the current or voltage signal.

19. A method according to claim 1, wherein a mathematical derivation of said current or voltage signal is used for the evaluation.

20. A method according to claim 1, wherein the amplitude curve of the fundamental mode of said current or voltage signal is used for the evaluation.

* * * * *